(12) United States Patent
Peng et al.

(10) Patent No.: US 7,529,090 B2
(45) Date of Patent: May 5, 2009

(54) HEAT DISSIPATION DEVICE

(75) Inventors: Xue-Wen Peng, Shenzhen (CN); Rui-Hua Chen, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/847,302

(22) Filed: Aug. 29, 2007

(65) Prior Publication Data

US 2009/0059538 A1    Mar. 5, 2009

(51) Int. Cl.
*H05K 7/20* (2006.01)
*F28F 7/00* (2006.01)
*H01L 23/34* (2006.01)

(52) U.S. Cl. ............. 361/700; 165/80.3; 165/104.33; 165/185; 361/694; 361/695; 361/697; 361/719; 257/718; 257/719

(58) Field of Classification Search ........... 165/121, 165/104.33; 361/697, 700
See application file for complete search history.

(56) References Cited

U.S. PATENT DOCUMENTS

| 5,930,115 | A | * | 7/1999 | Tracy et al. | 361/704 |
|---|---|---|---|---|---|
| 6,671,177 | B1 | | 12/2003 | Han | |
| 6,982,877 | B2 | * | 1/2006 | Vinson et al. | 361/719 |
| 7,277,280 | B2 | * | 10/2007 | Peng | 361/695 |
| 7,304,846 | B2 | * | 12/2007 | Wang et al. | 361/700 |
| 7,310,226 | B2 | * | 12/2007 | Chen et al. | 361/695 |
| 7,339,792 | B2 | * | 3/2008 | Han | 361/719 |
| 7,369,412 | B2 | * | 5/2008 | Peng et al. | 361/715 |
| 7,382,618 | B2 | * | 6/2008 | Peng et al. | 361/715 |
| 2002/0172008 | A1 | * | 11/2002 | Michael | 361/697 |
| 2004/0246678 | A1 | * | 12/2004 | Lin et al. | 361/697 |
| 2005/0185379 | A1 | * | 8/2005 | Vinson et al. | 361/704 |
| 2008/0080143 | A1 | * | 4/2008 | Peng et al. | 361/719 |

* cited by examiner

*Primary Examiner*—Gregory D Thompson
(74) *Attorney, Agent, or Firm*—Frank R. Niranjan

(57) ABSTRACT

A heat dissipation device includes a heat sink and two conductor bases. The heat sink includes two base plates attached to a graphics card and thermally connecting with two graphics processing units (GPUs) mounted on the graphics card, and a plurality of fins soldered on tops of the base plates. The conductor bases connect with the base plates of the heat sink and thermally connect with other electronic components mounted around the GPUs thereby to dissipate heat generated by the other electronic components. The GPUs and the other electronic components have different heights.

12 Claims, 5 Drawing Sheets

HEAT DISSIPATION DEVICE

BACKGROUND OF THE INVENTION

1. Field of the Invention

The present invention relates to a heat dissipation device, and more particularly to a heat dissipation device for computer add-on cards.

2. Description of Related Art

In order to enhance computers functions and performance, add-on units, including graphics cards, are often installed in the computers. The graphics cards each comprise a separate processor, called GPU (graphics processor unit). The GPU generates a large amount of heat during operation. When the temperature of the GPU exceeds a certain level, the GPU may malfunction, or in the worst case fail outright. For this reason, a heat dissipation device is commonly installed on the GPU to dissipate the heat generated by the GPU and other electronic components adjacent to it into ambient air.

Generally, the heat dissipation device comprises a heat sink and a base plate attached to electronic components mounted on the graphics card. However, if one electronic component has a height different from that of an adjacent electronic component, the base plate is not able to tightly contact with the electronic components with different heights; as a result, a large heat resistance will exist between the electronic components and the base plate, which will adversely affect the heat dissipation of the electronic components.

What is needed, therefore, is a heat dissipation device which can effectively dissipate heat generated by electronic components on a graphics card, wherein the electronic components have different heights.

SUMMARY OF THE INVENTION

A heat dissipation device includes a heat sink and two conductor bases. The heat sink includes two base plates attached to an add-on card and thermally connecting with two primary electronic components mounted on the added-on card, and a plurality of fins located at tops of the base plates. The conductor bases connect with the base plates of the heat sink and thermally connect with other electronic components around the primary electronic components to dissipate heat generated by the other electronic components. The primary electronic components and the other electronic components have different heights.

Other advantages and novel features will become more apparent from the following detailed description of preferred embodiments when taken in conjunction with the accompanying drawings, in which:

BRIEF DESCRIPTION OF THE DRAWINGS

Many aspects of the present apparatus can be better understood with reference to the following drawings. The components in the drawings are not necessarily drawn to scale, the emphasis instead being placed upon clearly illustrating the principles of the present apparatus and method. Moreover, in the drawings, like reference numerals designate corresponding parts throughout the several views.

DETAILED DESCRIPTION OF THE INVENTION

Figure 1:
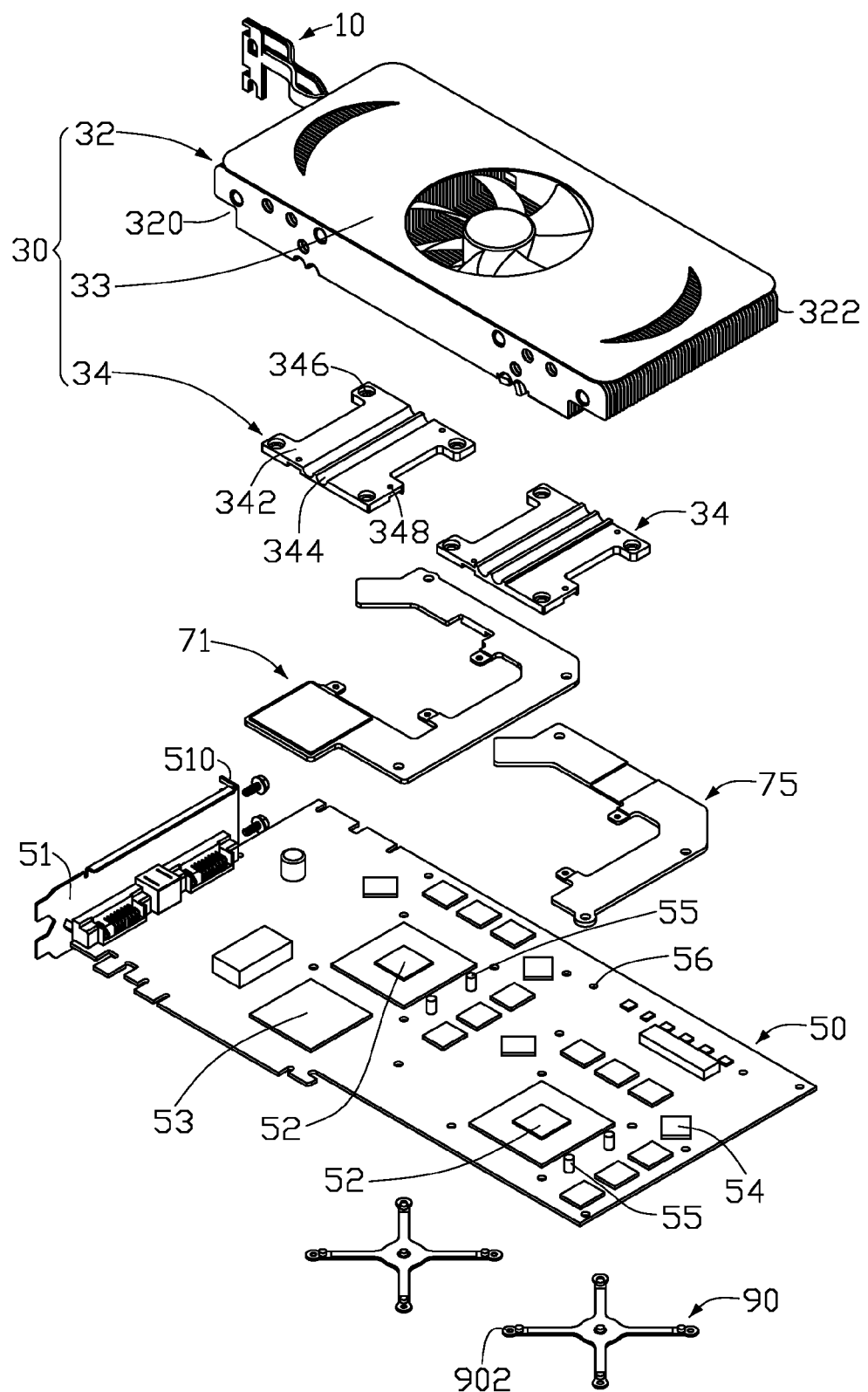
FIG. 1 is an exploded, isometric view of a heat dissipation device in accordance with a preferred embodiment of the present invention and a graphics card.
Figure 2:
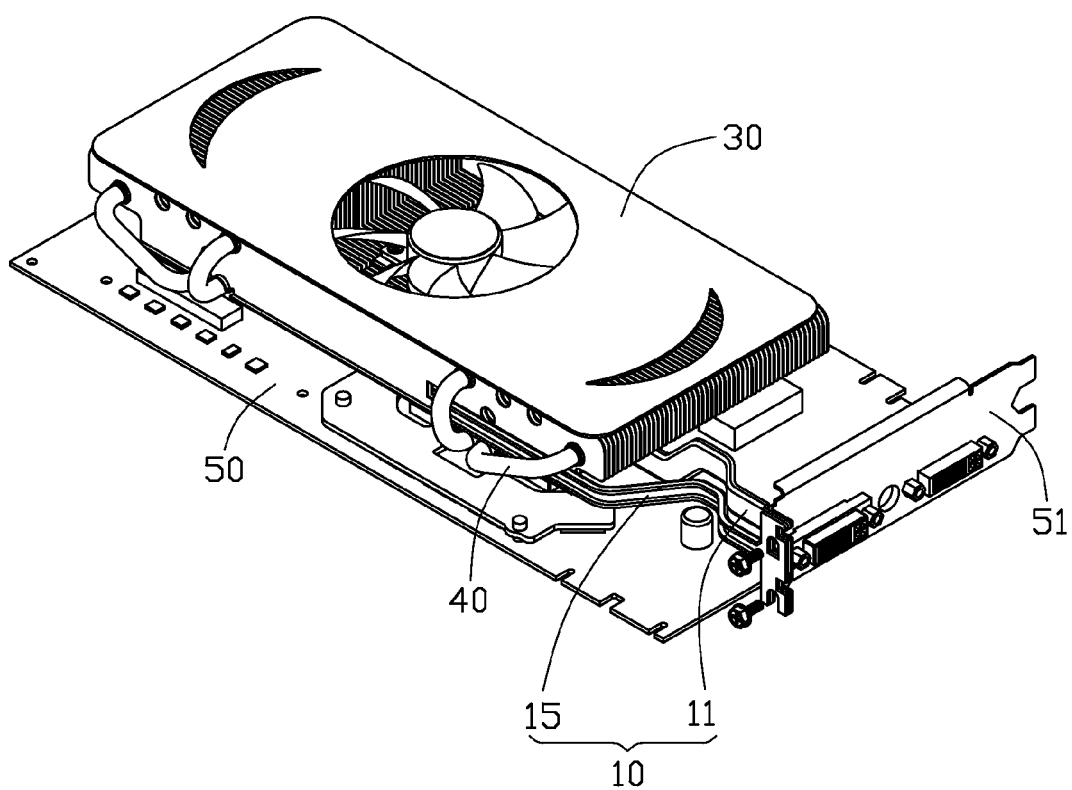
FIG. 2 is an assembled view of FIG. 1.

Referring to FIGS. 1-2, a heat dissipation device in accordance with a preferred embodiment of the present invention is illustrated. The heat dissipation device is mounted on a graphics card 50 in a computer enclosure (not shown) and used for dissipating heat generated by a pair of GPUs 52 mounted on the graphics card 50 and other electronic components 53,54 mounted around the GPUs 52. The heat dissipation device comprises a heat sink 30 and two conductor bases 71, 75.

The GPUs 52 are separately located at a top surface of the graphics card 50, and the electronic components 53,54 are located around the GPUs 52. A plurality of through holes 56 are defined around the GPUs 52. A mounting plate 51 is perpendicularly formed at a rear edge of the graphics card 50. A flange 510 is formed at an end of the mounting plate 51.

The heat sink 30 generally comprises a fin group 32, a pair of base plates 34 separately located at a bottom surface of the fin group 32, a plurality of heat pipes 40 thermally connecting the fin group 32 and the base plates 34, and a lid 33 mounted on a top of the fin group 32. A fan (not labeled) is mounted in a recessed portion defined in the top of the fin group 32. The lid 33 covers the fan, and defines an opening (not labeled) in alignment with the fan.

The fin group 32 comprises a plurality of parallel fins 322. The fin group 32 is cut away at a lower portion at opposite front and rear sides thereof to define a pair of opposite cutouts 320. Each base plate 34 has a rectangular shape and has a bottom face for contacting with the GPU 52. Four ears (not labeled) are formed at four corners of each base plate 34. A mounting hole 346 is defined in each of the four ears (not labeled) of each of the base plates 34 for providing a passage of a corresponding fastener (not shown) to mount the heat dissipation device on the graphics card 50. A screw hole 348 is defined in each of three of the four ears and located beside the corresponding mounting holes 346. A bottom surface of the base plate 34 has three recesses (not labeled) in the three ears, respectively, wherein the screw holes 348 are defined. A pair of adjoining semicircular grooves 344 are defined at a top surface 342 of the base plate 34 to receive the corresponding heat pipes 40 therein.

The conductor bases 71, 75 are attached on top surfaces of the electronic components 53, 54 for dissipating heat generated therefrom.

Figure 3:
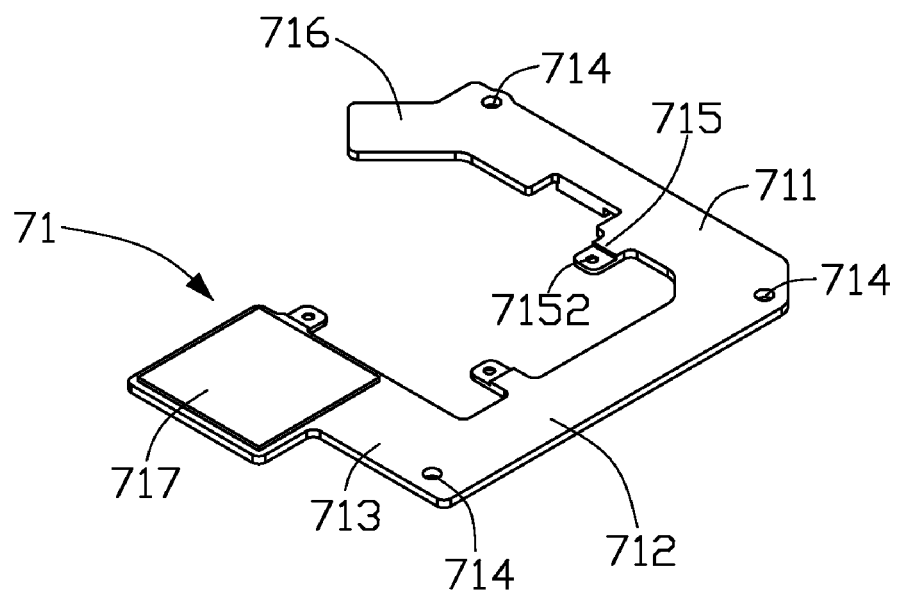
FIG. 3 is an enlarged view of conductor bases of the heat dissipation device of FIG. 1.
Figure 3:
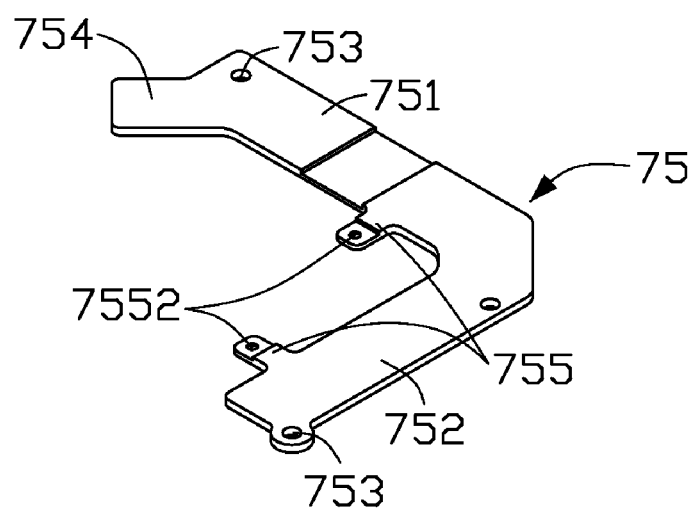

Referring to FIG. 3, the conductor base 71 comprises three elongated rectangular bodies 711, 712, 713. The bodies 711, 713 are parallel to each other. The body 712 is located between the bodies 711, 713 and perpendicularly interconnects them to form a U-shaped configuration. Three through holes 714 are defined in the conductor base 71 aligned with the corresponding through holes 56. Two of the through holes 714 are located at opposite ends of the body 712 and another through hole 714 is located at a corner of an outmost end of the body 711. An extension portion 716 extends outwardly and inclinedly from an end of the body 711. A cutout (not labeled) is defined in an inner side of a center of the body 711 to prevent the heat pipes 40 of the heat sink 30 and the conductor base 71 from interfering with each other when the heat sink 30 and the conductor base 71 are assembled together. An extension plate 717 extends outwardly from an outmost end of the body 713. A cantilever 715 is formed to extend from an inner side of each of the bodies 711, 712, 713. The cantilever 715 of the body 711 is located adjacent to the cutout of the body 711. The cantilever 715 of the body 712 extends perpendicularly from an end of the body 712 adjacent to the body 713. The cantilever 715 of the body 713 extends perpendicularly near an end of the extension plate 717. Each of the cantilevers 715 defines a mounting hole 7152 at a free end thereof, which is aligned with a corresponding screw hole 348 of the base plate 34.

The conductor base 75 is similar to the conductor base 71. The conductor base 75 comprises two elongated rectangular bodies 751, 752. The bodies 751, 752 perpendicularly interconnect each other to form an L-shaped configuration. Three through holes 753 are defined in the conductor base 75 and aligned with the corresponding through holes 56 of the graphics card 50. An extension portion 754 extends outwardly and inclinedly from an end of the body 751. A recess (not labeled) is defined at a central of the body 751 to prevent the heat pipes 40 of the heat sink 30 and the conductor base 75 from interfering with each other. Two cantilevers 755 are formed to extend from inner sides of the bodies 751, 752. The cantilever 755 of the body 751 extends perpendicularly from the body 751 at a position adjacent to the recess of the body 751. The cantilever 755 of the body 752 extends perpendicularly from an end of the body 752. Each of the cantilevers 755 defines a mounting hole 7552 at a free end thereof, which is aligned with a corresponding screw hole 348 of the base plate 34.

After the base plates 34 are assembled with the fin group 32, screws (not labeled) extend through the through holes 7152, 7552 of the cantilevers 715, 755 of the conductor bases 71, 75 to screw in the screw holes 348 of the base plates 34 of the heat sink 30 to assemble the conductor bases 71, 75 and the base plates 34 together. The free ends of the cantilevers 715, 755 are received in the recesses of the base plates 34, with bottom surfaces thereof are coplanar with the bottom surfaces of the base plates 34. The configuration of the conductor bases 71,75 depends on the arrangement of the electronic components 53,54 mounted on the graphics card 50.

Figure 4:
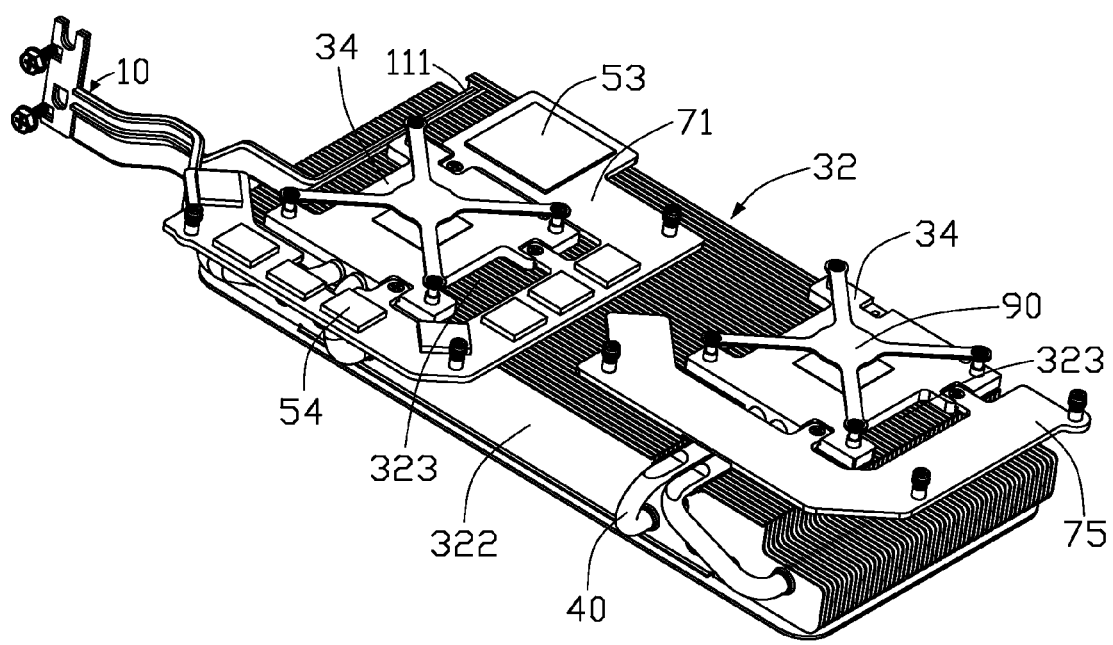
FIG. 4 is a view similar to FIG. 2, but shown from a bottom aspect, wherein the graphics card is taken away for clarity.

Referring to FIG. 4, after the conductor bases 71, 75 and the base plates 34 are assembled together, some gaps 323 are defined between the conductor bases 71, 75 and the base plates 34 to receive therein some other components 55, such as capacitors which are higher than the GPUs 52 and the electronic components 53, 54. The GPUs 52 have a height different from that of the electronic components 53, 54. More specifically, top edges of the GPUs 52 are located above top edges of the electronic components 53, 54, as viewed from FIG. 1. The thickness of the conductor bases 71, 75 are determined on the thickness of the electronic components 53, 54 to make sure that the conductor bases 71, 75 can tightly contact with the electronic components 53, 54.

The heat dissipation device further comprises two back plates 90 to reinforce the graphics card 50. The back plates 90 are separately positioned below the bottom side of the graphics card 50. Each back plate 90 is cross-shaped and defines four through holes 902 therein. Screws (not shown) extend through the through holes 902 of each back plate 90 and the graphics card 50 to screw in the mounting holes 346 of the bases 34 to mount the back plates 90 to the graphics card 50. Thus, the heat dissipation device is mounted to the graphics card 50.

The heat dissipation device further comprises a fixing bracket 10 which helps to attach the heat sink 30 to a panel of the computer enclosure, whereby a portion of weight of the heat sink 30 can be supported by the computer enclosure; thus a pressure exerted on the graphics card 50 by the weight of the heat sink 30 can be reduced.

Figure 5:
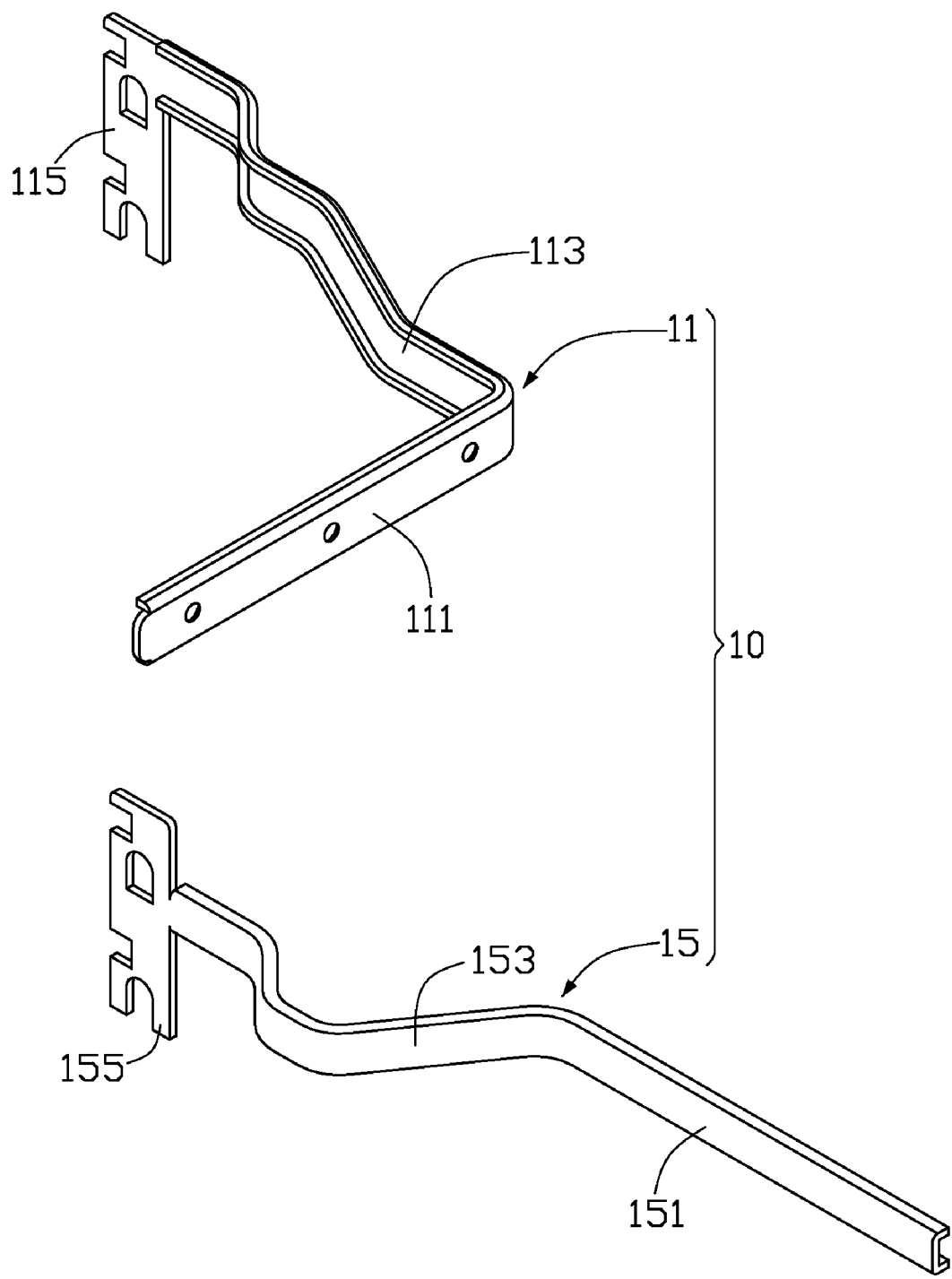
FIG. 5 is an enlarged view of a fixing bracket of the heat dissipation device of FIG. 1.

Referring to FIGS. 4-5, the fixing bracket 10 is made from a metallic sheet and comprises a first fixing bracket 11 and a second fixing bracket 15.

The first fixing bracket 11 comprises a connecting portion 111, an extension portion 113 extending from an end of the connecting portion 111 and a securing portion 115 extending perpendicularly from a free end of the extension portion 113. The connecting portion 111 has an elongated, rectangular configuration and engages with a rear edge of the fin group 32 at the cutout 320 adjacent to the mounting plate 51 of the graphics card 50. The extension portion 113 has a curved configuration to reinforce the elasticity of the first fixing bracket 11.

The second fixing bracket 15 is similar to the first fixing bracket 11 and comprises a connecting portion 151, an extension portion 153 and a securing portion 155. The connecting portion 151 has an elongated rectangular shape and soldered to a lateral side of the fin group 32. The extension portion 153 extends from an end of the connecting portion 151. The securing portion 155 extends perpendicularly from the extension portion 153 and has a configuration similar to that of the securing portion 115 of the first fixing bracket 11.

In assembly, the connecting portions 111, 151 of the fixing bracket 10 are fixed to the fin group 32 and the securing portions 115, 155 are overlapped each other. Screws (not labeled) extend through the securing portions 115, 155, the flange 510 of the mounting plate 51 of the graphics card 50 and the panel of the computer enclosure to mount the first and the second fixing brackets 11, 15 to the computer enclosure.

It is believed that the present embodiments and their advantages will be understood from the foregoing description, and it will be apparent that various changes may be made thereto without departing from the spirit and scope of the invention or sacrificing all of its material advantages, the examples hereto described merely being preferred or exemplary embodiments of the invention.

What is claimed is:

1. A heat dissipation device for dissipating heat generated by electronic components mounted on an add-on card, comprising:
    a heat sink comprising a base plate attached to the add-on card and thermally connecting with a primary electronic component mounted on the added-on card and a plurality of fins located at a top of the base plate; and
    a conductor base connecting with the base plate of the heat sink and thermally connecting with other electronic components around the primary electronic component to dissipate heat generated by the other electronic components, wherein the conductor base comprises a plurality of elongated bodies, and a cantilever extends from an inner side of each of the bodies to connect with the base plate of the heat sink;
    wherein the other electronic components each have a first height while the primary electronic component has a second height which is different from the first height and;
    wherein at least a gap is defined between the conductor base and the base plate of the heat sink to receive further other electronic components therein, the further other electronic components being higher than the primary and the other electronic components.

2. The heat dissipation device of claim 1, wherein the bodies of the conductor base connect with each other to form a U-shaped configuration.

3. The heat dissipation device of claim 1, wherein the bodies of the conductor base connect with each other to form an L-shaped configuration.

4. The heat dissipation device of claim 1, wherein the heat sink further comprises a heat pipe thermally connecting with the fins and the base plate of the heat sink.

5. The heat dissipation device of claim 4, wherein a cutout is defined in the inner side of one of the bodies of the conductor base to prevent the heat pipe of the heat sink and the conductor base from interfering with each other.

6. The heat dissipation device of claim 4, wherein a recess is defined at a center of one of the bodies of the conductor base to prevent the heat pipe of the heat sink and the conductor base from interfering with each other.

7. The heat dissipation device of claim 1, wherein fasteners extend through the cantilevers of the bodies of the conductor base and the base plate of the heat sink to mount the conductor base to the heat sink.

8. A heat dissipation device for dissipating heat generated by electronic components mounted on an add-on card, comprising:
    a pair of base plates attached to the add-on card and thermally connecting with a pair of primary electronic components mounted on the added-on card, respectively;
    a plurality of fins mounted on the base plates;
    a fan mounted on the fins;
    a lid mounted on the fins and covering the fan; and
    two conductor bases connecting with the base plate, respectively, one of the two conductor bases thermally connecting with a first set of other electronic components around one of the primary electronic components to dissipate heat generated by the first set of other electronic components, the other conductor base thermally connecting with a second set of other electronic components around another one of the primary electronic components to dissipate heat generated by the second set of other electronic components, wherein the fins are also mounted on the two conductor bases;
    wherein the primary electronic components each have a first height, the first set of other electronic components has a second height and the second set of other electronic component has a third height, the first height being different from the second height and the third height.

9. The heat dissipation device of claim 8, wherein one of the conductor bases comprises three elongated bodies to form a U-shaped configuration and the other conductor base comprises two elongated bodies to form an L-shaped configuration.

10. The heat dissipation device of claim 9, wherein a cantilever extends from an inner side of each of the bodies of a corresponding conductor base, the cantilever connects with a corresponding base plate, and a fastener extends through the cantilever of the corresponding conductor base and the corresponding base plate to fasten them together.

11. The heat dissipation device of claim 8, further comprising a plurality of heat pipes, some of the heat pipes thermally connecting with the fins and one of the base plates of the heat sink, others of the heat pipes thermally connecting with the fins and another of the base plates of the heat sink.

12. A heat dissipation device for dissipating heat generated by electronic components mounted on an add-on card, comprising:
    a heat sink comprising a base plate attached to the add-on card and thermally connecting with a primary electronic component mounted on the added-on card and a plurality of fins located at a top of the base plate; and
    a conductor base connecting with the base plate of the heat sink and thermally connecting with other electronic components around the primary electronic component to dissipate heat generated by the other electronic components, wherein the conductor base comprises a plurality of elongated bodies, and a cantilever extends from an inner side of each of the bodies to connect with the base plate of the heat sink;
    wherein the other electronic components each have a first height while the primary electronic component has a second height which is different from the first height;
    wherein the heat sink further comprises a heat pipe thermally connecting with the fins and the base plate of the heat sink and;
    wherein a recess is defined at a center of one of the bodies of the conductor base to prevent the heat pipe of the heat sink and the conductor base from interfering with each other.

* * * * *